(12) United States Patent
Kofuji et al.

(10) Patent No.: US 9,099,349 B2
(45) Date of Patent: Aug. 4, 2015

(54) SEMICONDUCTOR DEVICE MANUFACTURING METHOD

(71) Applicant: HITACHI HIGH-TECHNOLOGIES CORPORATION, Tokyo (JP)

(72) Inventors: Naoyuki Kofuji, Tama (JP); Nobuyuki Negishi, Tokyo (JP); Hiroaki Ishimura, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 13/958,685

(22) Filed: Aug. 5, 2013

(65) Prior Publication Data

US 2014/0175534 A1    Jun. 26, 2014

(30) Foreign Application Priority Data

Dec. 25, 2012    (JP) ................. 2012-280480

(51) Int. Cl.
*H01L 21/336* (2006.01)
*H01L 27/115* (2006.01)
*H01L 29/66* (2006.01)
*H01L 29/792* (2006.01)
*H01L 21/311* (2006.01)

(52) U.S. Cl.
CPC .... *H01L 27/11582* (2013.01); *H01L 29/66833* (2013.01); *H01L 29/7926* (2013.01); *H01L 21/31144* (2013.01); *H01L 27/11556* (2013.01)

(58) Field of Classification Search
USPC .......................... 438/588, 668; 257/E21.614
See application file for complete search history.

(56) References Cited

U.S. PATENT DOCUMENTS 8,048,741 B2 * 11/2011  Arai et al. ...................... 438/268
8,519,472 B2 *  8/2013  Jeong et al. .................... 257/326

OTHER PUBLICATIONS

J. Jang, et al.; "Vertical Cell Array using TCAT (Terabit Cell Array Transistor) Technology for Ultra High Density NAND Flash Memory"; Proceedings of 2009 Symposium on VLSI Technology Digest of Technical Papers; pp. 192-193.

* cited by examiner

*Primary Examiner* — Chandra Chaudhari
(74) *Attorney, Agent, or Firm* — Mattingly & Malur, PC

(57) ABSTRACT

In a process of dividing gates of multi-layered films in fabricating a NAND flash memory having a three-dimensional structure, a pattern is prevented from deforming and falling. A ratio of a length L to a height h of control gate groups configuring a memory cell of the flash memory is set to be less than 1.65 which is a range in which buckling does not occur. It is desirable that a ratio of a length L to a width W of the control gate groups is set to be less than 16.5.

10 Claims, 18 Drawing Sheets

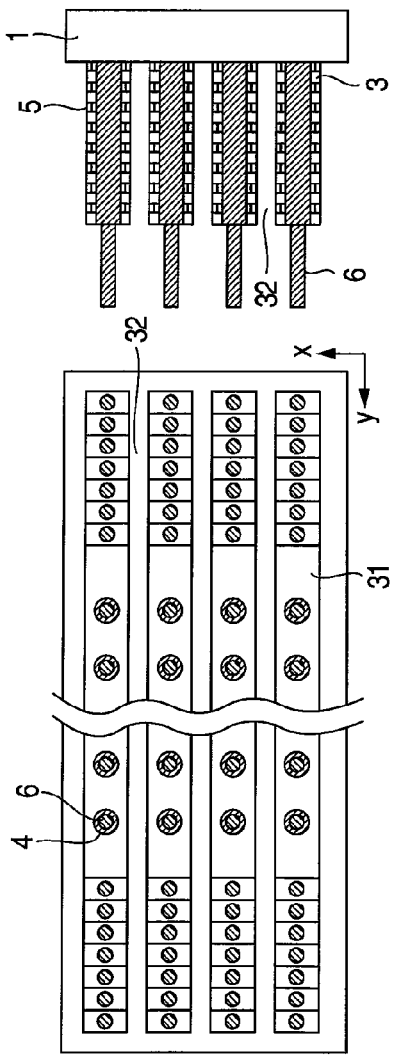
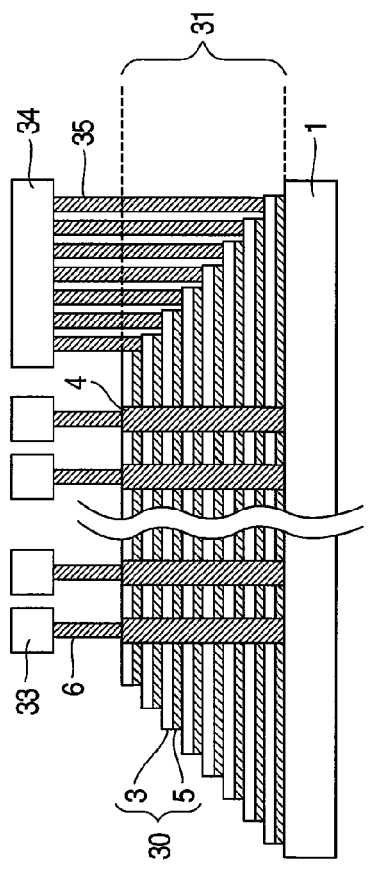

(A) BEFORE ETCHING  (B) AFTER ETCHING

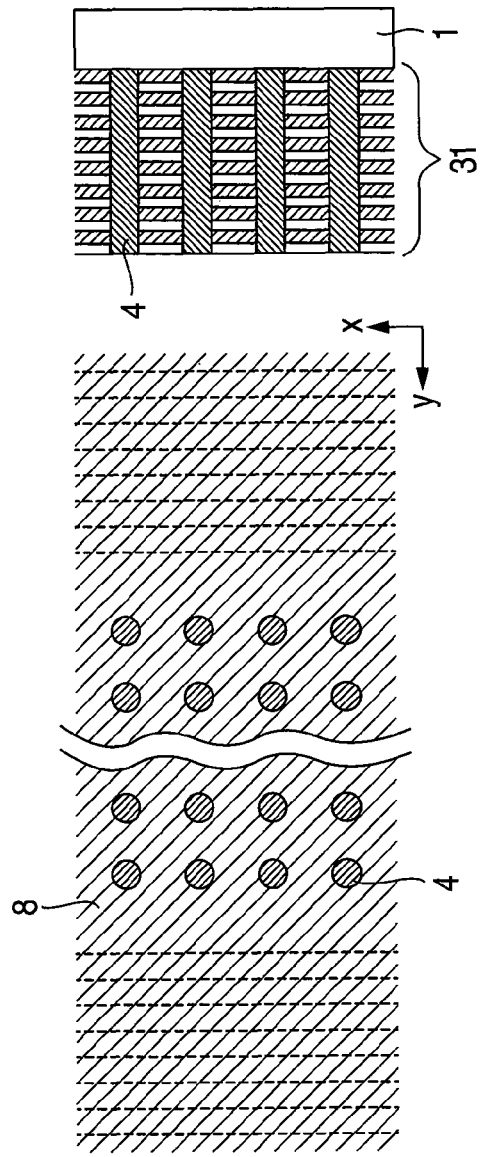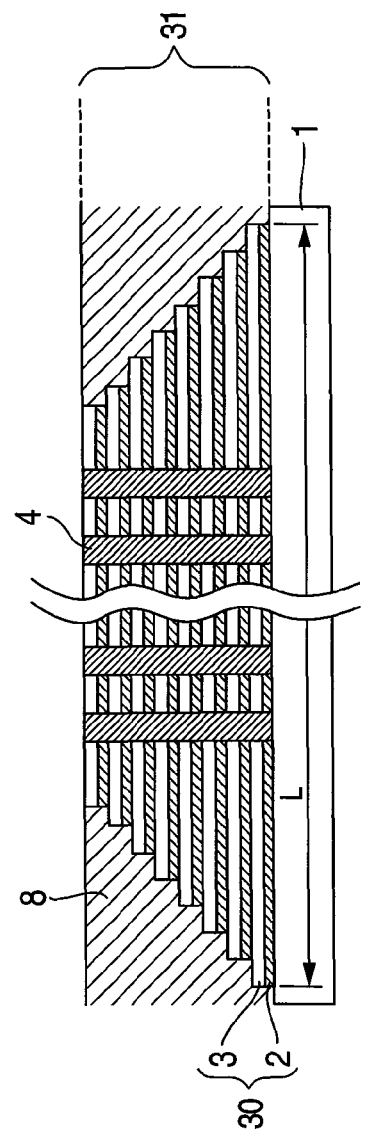

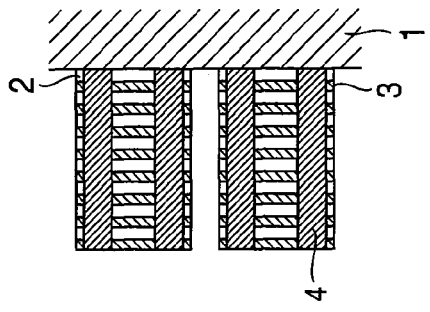
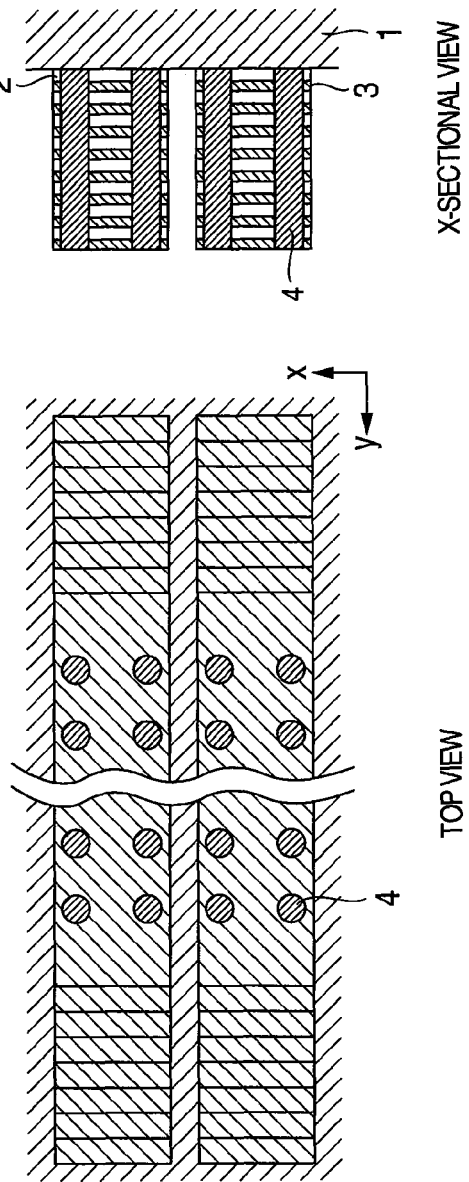
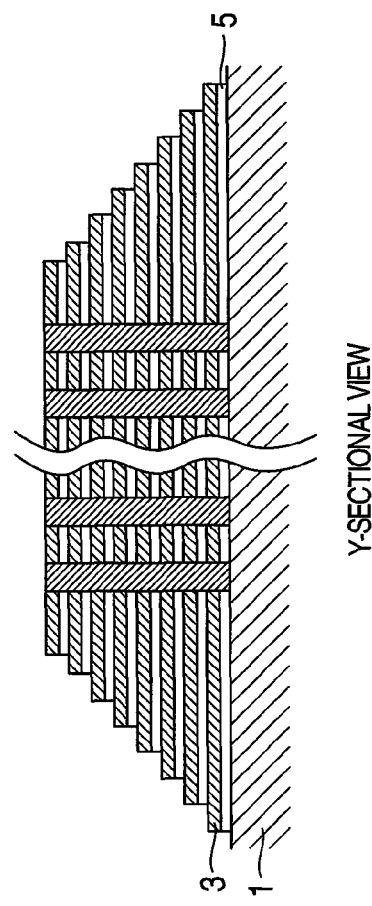

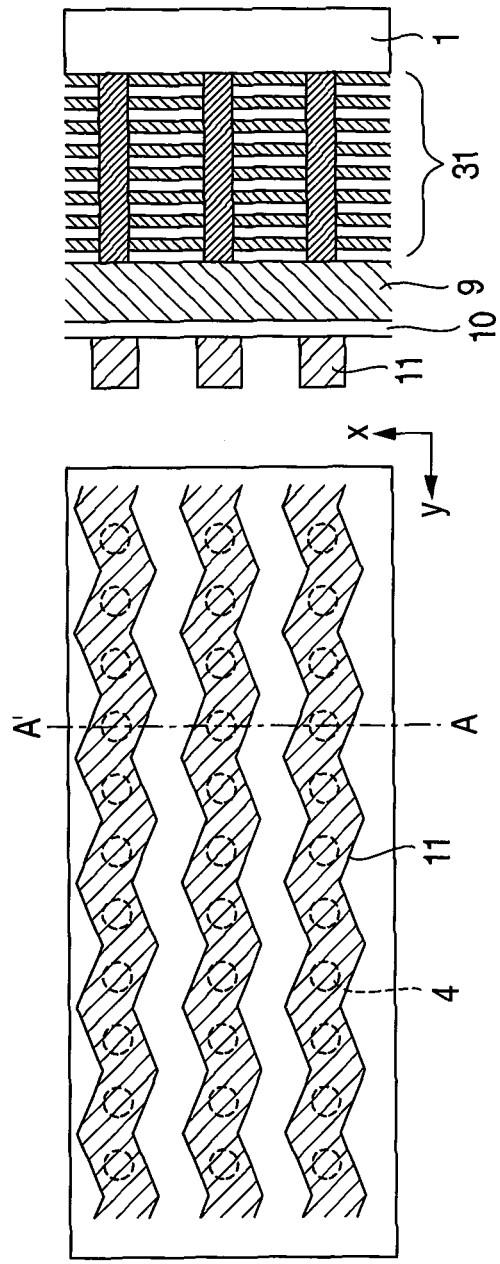

US 9,099,349 B2

SEMICONDUCTOR DEVICE MANUFACTURING METHOD

BACKGROUND OF THE INVENTION

The present invention relates to a semiconductor device and a manufacturing method thereof, and, more particularly, to a method of forming line patterns having high aspect ratios indispensable to manufacture of a NAND-flash memory having a three-dimensional structure.

With demands for semiconductor devices with higher speed and higher density, semiconductor devices having three-dimensional structures are being developed actively in recent years. For example, "Vertical Cell Array using TCAT (Terabit Cell Array Transistor) Technology for Ultra High Density NAND Flash Memory" by J. Jang, et al., Proceedings of 2009 Symposium on VLSI Technology, pp. 192-193 discloses an example of a 3D NAND-flash memory (hereinafter, abbreviated as 3D-NAND). FIGS. 1A to 1C schematically show three orthogonal views of a 3D-NAND memory cell. FIG. 1A shows a top view of the 3D-NAND memory cell viewed from above, FIG. 1B shows a side view of the top view of FIG. 1A viewed from the right side of the sheet (the structure viewed in the y direction), and FIG. 1C shows a front view of the top view of FIG. 1A viewed from the bottom side of the sheet (the structure viewed in the x direction). The memory cell actually extends long in the lateral direction (in the y direction) of the sheet, and each of FIG. 1A and FIG. 1C shows only ends of the both sides of the memory cell. In FIG. 1A, incidentally, bit lines 33 and word lines 34 shown in FIG. 1C are omitted from showing in the drawing.

The above 3D-NAND memory cell has a structure that control gate layers 30, each of which comprises a multi-layered film of a tungsten film 5 (a conductive film) and a $SiO_2$ film 3 (an insulating film), are additionally stacked stepwise on a semiconductor substrate (a Si substrate) 1 and cylindrical channel holes 4 which are filled with polysilicon are formed therein, as shown in FIG. 1C. Incidentally, in the initial stage of the manufacturing process, the control gate layer 30 is formed as a multi-layered film of a $Si_3N_4$ film and a $SiO_2$ film 3, and the $Si_3N_4$ film is replaced by the tungsten film 5 during the manufacturing process. To operate the tungsten film 5 included in the control gate layer 30 as the gate electrode, the control gate layers 30 are stacked stepwise to form a terrace structure and are respectively connected with the word lines 34 through contact holes 35. The multi-layered films of the control gate layers 30 are called hereinafter as a control gate group 31 for convenience. The control gate group 31 is divided in the x direction by trenches (spaces) 32 as shown in FIG. 1B and has a line-and-space structure as shown in FIG. 1A when viewed from above.

A contact hole 6 is formed on the channel hole 4 and connected to the bit line 33 further formed on it. An ONO film, which is not shown in the drawing, is formed as a charge trap material on the inner wall surface (an interface between wall surfaces of holes formed in the control gate groups 31 and pillars of polysilicon filled therein) of the channel hole 4 and operates as a capacitor of the memory cell.

The 3D-NAND memory cell disclosed in "Vertical Cell Array using TCAT (Terabit Cell Array Transistor) Technology for Ultra High Density NAND Flash Memory" by J. Jang, et al., Proceedings of 2009 Symposium on VLSI Technology, pp. 192-193 has a characteristics that the control gate group 31 is divided in the x direction by the trenches 32 as shown in FIG. 1B. These trenches 32 are formed by etching. FIG. 2 shows in Part (A) and Part (B) patterns before and after the process of forming the trenches 32 in the same side views as FIG. 1B. Part (A) of FIG. 2 shows the pattern before etching, and Part (B) of FIG. 2 shows the pattern after etching, respectively. In the state before etching shown in Part (A) of FIG. 2, the control gate layers 30 each of which comprises the above-described multi-layered film of the $Si_3N_4$ film 2 and the $SiO_2$ film 3 are stacked on the Si substrate 1, and the channel holes 4 which are filled with polysilicon are formed therein. A line-and-space resist pattern is formed on its top surface by lithography, and the trenches 32 shown in Part (B) of FIG. 2 are formed by dry etching with it as a mask.

In the memory cell shown in FIGS. 1A to 1C, the control gate group has eight of the control gate layers 30 stacked together; for a higher density, however, it is necessary to increase the number of the stacked layers or to reduce the interval of channel holes in the x and y directions by reducing the diameters of the channel holes 4. For example, "Vertical Cell Array using TCAT (Terabit Cell Array Transistor) Technology for Ultra High Density NAND Flash Memory" by J. Jang, et al., Proceedings of 2009 Symposium on VLSI Technology, pp. 192-193 proposes as future developments that cost per bit (bit cost) is reduced by setting the number of the stacked layers of the control gate layers 30 to 128 layers and/or reducing the diameters of the channel holes 4 to 45 nm.

SUMMARY OF THE INVENTION

In the 3D-NAND disclosed in "Vertical Cell Array using TCAT (Terabit Cell Array Transistor) Technology for Ultra High Density NAND Flash Memory" by J. Jang, et al., Proceedings of 2009 Symposium on VLSI Technology, pp. 192-193, when the number of the stacked layers of the control gate layers 30 is increased in order to provide the memory cell with high density, the height of the control gate group 31 increases. It is possible to suppress the height of the control gate group from increasing by reducing the thickness of the control gate layer 30, but it is actually difficult to do so. When the thickness of the tungsten film 5 is reduced, an amount of electric charge trapped at the ONO film for charge trap becomes excessively small, and data holding capacity of the NAND-flash memory lowers. Also, the reduction of the thickness of the $SiO_2$ film 3 causes a phenomenon called crosstalk in which erroneous data are written due to a signal of the adjacent control gate. Therefore, it is actually impossible to reduce considerably the thicknesses of the tungsten film 5 and the $SiO_2$ film 3.

When the diameters of the channel holes 4 are reduced to narrow the intervals of the channel holes, the width of the control gate group 31 (the length in the x direction of FIG. 1A) is also reduced naturally. Therefore, when the number of the stacked layers is increased and the diameters of the channel holes are reduced, a ratio of a height to a pattern width, namely the aspect ratio (here, a value obtained by dividing the height by the width), becomes large naturally.

As a result of analysis performed by the present inventors, it has become clear that, when the aspect ratio becomes large, deformation of a pattern which is called "wiggling" occurs in the process of dividing the control gate group 31 into the lines and spaces. The occurrence of "wiggling" becomes particularly prominent when the aspect ratio becomes 10 or more. The "wiggling" is a phenomenon that a pattern with a high aspect ratio falls while waving right and left; FIG. 3A and FIG. 3B respectively show a top view and a cross-sectional view of a memory cell with "wiggling". FIG. 3B shows a cross-sectional view of FIG. 3A along a line l-m, showing that etching of the multi-layered film to form the trenches 32 has stopped midway as adjacent patterns contacted with each other. In addition, since etching does not reach the lower layer, there occurs a problem that a gate electrode on the lower layer is electrically shorted or a channel portion is destroyed by deformation. Otherwise, the deformation may not occur so heavily to cause the control gate groups 31 contact with each other, but there may be a problem that the lines and spaces have waviness to displace the channel positions from their design, and the channel holes 4 and the contact holes 6 shown in FIG. 1C cannot be connected properly.

Therefore, an objective of the present invention is to provide, for a semiconductor device provided with semiconductor element blocks which are formed by forming multi-layered films for forming active elements on a semiconductor substrate and separating the multi-layered films by interlayer insulating materials or a method of manufacturing the semiconductor device such as the above-described 3D-NAND, a method for suppressing a short-circuit from occurring between the above-described semiconductor element blocks due to "wiggling" and a semiconductor device which does not have the above problems.

In addition, another objective of the present invention is to provide, for a semiconductor device which is provided with a semiconductor element block where multi-layered films for forming film-like active elements are formed on the above-described semiconductor substrate and the multi-layered films are separated from each other by interlayer insulating materials or a method of manufacturing the above semiconductor device, a manufacturing method of a semiconductor device with a connection failure being suppressed from occurring between the semiconductor element block and distribution electrodes or wirings, or such a semiconductor device.

As a result of analysis, the present inventors have found that the above "wiggling" is caused by a stress acting on the films, and "wiggling" can be suppressed from occurring by setting a ratio of a height and a width or a height and a length of the semiconductor element block, which is divided into lines and spaces by etching, to a range in which buckling does not occur. Therefore, the present invention solves the above-described problems by setting the ratio of a height and a width or a height and a length of the above semiconductor element block to the range in which buckling does not occur.

The present inventors have also found that, even if the semiconductor element block divided into lines and spaces may have waviness, a force to deform patterns is not applied substantially to positions where a second-order derivative of waviness becomes zero. Therefore, the present invention suppresses displacement of channel holes from design positions by causing adjacent line-and-space patterns to wave in the same shape in advance and forming the channel holes in positions where the second-order derivative of waviness becomes zero, thereby solving the above-described problem so that "the connection failure between the channel holes and the contact holes is suppressed from occurring".

According to the present invention, "wiggling" can be reduced. Otherwise, deterioration of the device properties can be minimized even when "wiggling" occurs.

Other objects, features, and advantages of the invention will become apparent from the following description of the embodiments of the invention taken in conjunction with the accompanying drawings.

BRIEF DESCRIPTION OF THE DRAWINGS

FIGS. 1A, 1B, and 1C are a top view, a side view, and a front view showing a 3D-NAND memory cell structure, respectively;

FIGS. 8A, 8B, and 8C are a top view, a side view, and a front view illustrating a process of fabricating a multi-layered film in a memory cell according to a first embodiment into lines and spaces, respectively;

FIGS. 17A, 17B, and 17C show an example of dividing etching of the multi-layered film according to the second embodiment;

FIGS. 31A and 31B show an example of a layout of a reticle for exposure according to the fourth embodiment.

DESCRIPTION OF THE EMBODIMENTS

First Embodiment

First, a mechanism that "wiggling" occurs in a semiconductor device, which is provided with a semiconductor element block of a line-and-space form, is described referring to a line pattern formed of a single layer film as an example.

As described previously, the control gate layer of the 3D-NAND has a $SiO_2$ film deposited and formed on a $Si_3N_4$ film by CVD in the initial stage of the manufacturing process. It is known that a material formed by CVD, not limited to 3D-NAND manufacturing processes, has a very small residual stress when the film is formed. It was also found that when the multi-layered film of the control gate layer is fabricated into lines and spaces by etching, a stress is generated in the multi-layered film as the multi-layered film deteriorates in the etching process, and the multi-layered film is deformed by the stress. Therefore, "wiggling" is considered to occur due to two factors of the above-described residual stress and the deterioration of the multi-layered film due to etching, and it is presumed that "wiggling" tends to occur in the multi-layered film than in the single layer film.

Figure 2:
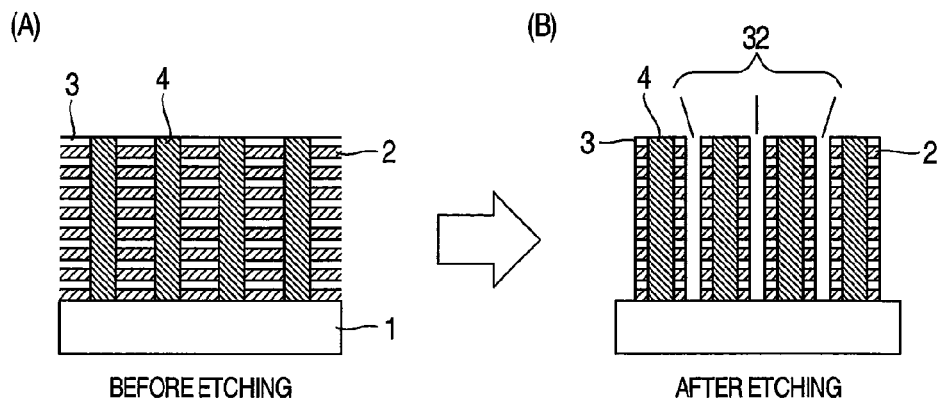
FIG. 2 shows side views of the memory cell before and after a 3D-NAND etching process.
Figure 3A:
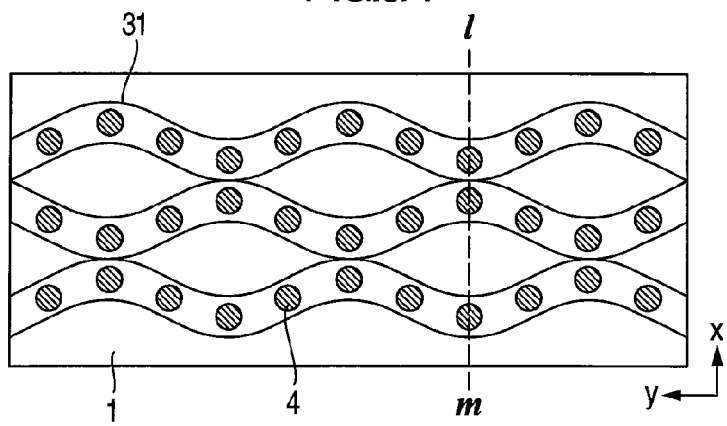
FIGS. 3A and 3B are a top view and a cross-sectional view of a memory cell in which "wiggling" occurred, respectively.
Figure 3B:
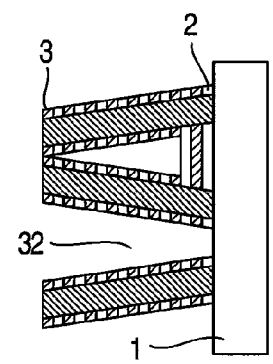
Figure 4A:
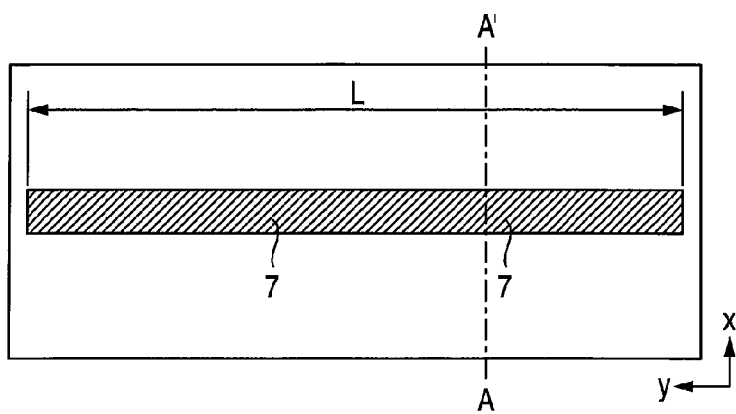
FIGS. 4A and 4B are a top view and a side view showing a line pattern before occurrence of buckling, respectively.
Figure 4B:
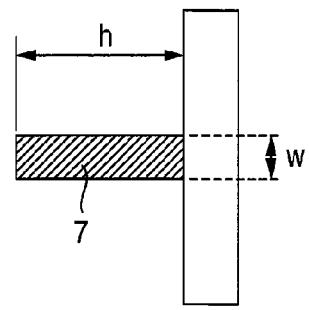
Figure 5A:
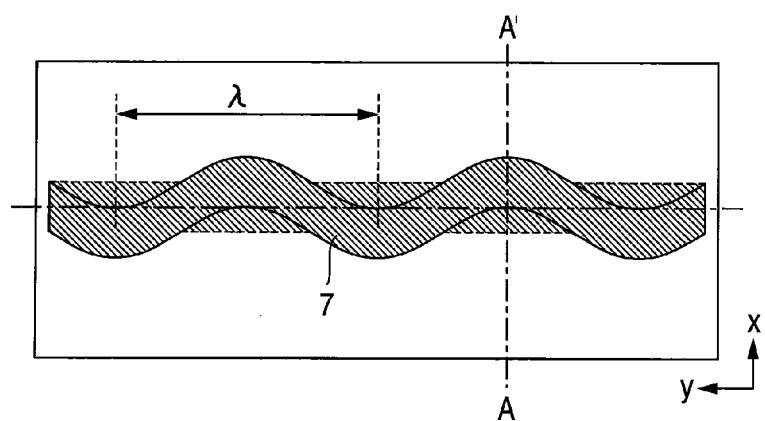
FIGS. 5A and 5B are a top view and a side view showing a line pattern after occurrence of buckling, respectively.
Figure 5B:
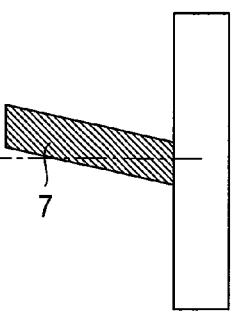

In view of the phenomenon, it was found from the analysis result that "wiggling" has two modes: buckling and waviness amplification. In FIGS. 4A, 4B, 5A, and 5B, examples of patterns suffered from buckling are shown as being compared before and after buckling. The buckling is a phenomenon where a line pattern 7 which is straight as shown in FIGS. 4A and 4B is deformed and falls due to a stress. FIG. 4A shows a top view of the line pattern 7 showing a state that there is formed a pattern having a height h, a length L in a longitudinal direction (the y direction), and a width w in a short-side direction (a length in the x direction, which may also be defined as a thickness). FIG. 4B is a cross-sectional view showing a cross section of the line pattern shown in FIG. 4A taken along the line A-A'. FIG. 5A shows a top view of the pattern which was fallen by buckling, and the line pattern 7 before occurrence of buckling is also indicated by a dotted line for reference. Similar to FIG. 4B, FIG. 5B is a cross-sectional view showing a cross section of the line pattern shown in FIG. 5A taken along the line A-A'. As shown in FIG. 5A, it is known that the pattern waves at a certain cycle when buckling occurs. This cycle is called as a buckling cycle λ, and it is shown by in FIG. 5A.

It was found as a result of numerical computation that the condition of buckling generation is expressed by the following Expression 1.

Figure 6:
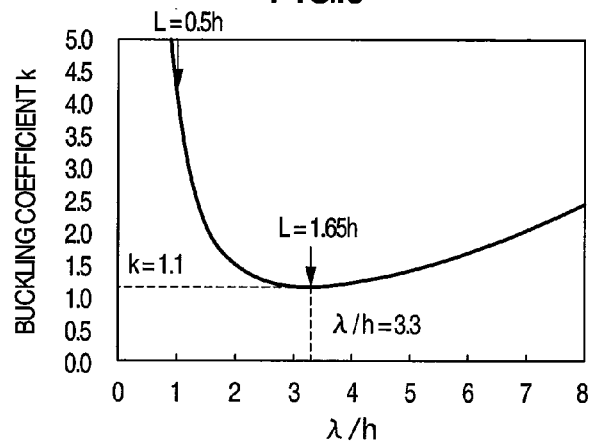
FIG. 6 is a graph of a simulated result showing a relation between a buckling cycle-to-pattern height ratio $\lambda/h$ and a buckling coefficient k.

[MATH. 1]

$$\gamma \equiv \left(\frac{h}{w}\right)^2 \frac{\sigma}{E} > k \quad (1)$$

where γ is a buckling factor, σ is a residual stress (Pa), E is Young's modulus (Pa), w is a pattern width, h is a pattern height, and k is a buckling coefficient The left hand side of Expression 1 is a dimensionless value which is obtained by multiplying a ratio between the residual stress σ and the Young's modulus E with a square of the aspect ratio h/w. This value was defined as buckling factor γ by the present inventors. On the other hand, the right hand side k of Expression 1 is a dimensionless value called as a buckling coefficient, and when the buckling factor γ exceeds the buckling coefficient k, buckling occurs. As a result of numerical computation, it was found that the buckling coefficient k closely relates to the height h (see, for example, FIG. 4B) of the pattern and the buckling cycle λ shown in FIG. 5. FIG. 6 shows a result of numerical computation showing a relation between the buckling coefficient k and the value λ/h (dimensionless). It was found from the result of numerical computation that the buckling coefficient k is a function of the value λ/h and has a minimum value 1.1 when λ/h is 3.3, regardless of the material or the film thickness.

Materials usually used for semiconductor devices, such as $SiO_2$ and $Si_3N_4$, for example, are known to have residual stresses σ corresponding to several percent of Young's moduli E and, therefore, the left hand side of Expression 1 always has a finite value. Because of this, when the aspect ratio h/w increases, the value of the left hand side of Expression 1 increases, and when it becomes larger than the buckling coefficient k, buckling occurs. If σ/E is 1%, at the aspect ratio h/w of around 11, the buckling factor γ exceeds a minimum value of 1.1 of the buckling coefficient k to have a possibility that buckling occurs.

Next, restriction of possible values of the buckling cycle λ is described below. When the line pattern length is a finite value L (while the length is presumed to be defined as shown in FIG. 4A), the buckling cycle λ must satisfy the following conditions.

[MATH. 2]

$$L = n\frac{\lambda}{2} \quad (2)$$

where n is a positive integer.

As described above, buckling tends to occur most (that is, the buckling coefficient k takes a minimum value of 1.1) when λ/h is 3.3, namely when the value λ is 3.3h. Considering the relation between the above and Expression 2, the value of λ/h can have 3.3 when L becomes multiples of 1.65h. That is to say, when the relation between L and h satisfies the relation of L=1.65h, k always has a minimum value of 1.1, and buckling occurs at a smaller stress with a small aspect ratio.

Meanwhile, when L is smaller than 1.65h, the value λ can only take a value smaller than 3.3h. Therefore, λ/h is inevitably smaller than 3.3, and k also becomes always larger than the minimum value 1.1. Therefore, the stress required to cause buckling to occur becomes large, and an allowable aspect ratio also becomes large.

For example, when L=1.65h, values that λ may take are 3.3h, 3.3h/2, 3.3h/3, and so on. Therefore, possible values of λ/h are 3.3, 3.3/2, 3.3/3, and so on. According to the relation shown in FIG. 6, k has a minimum value 1.1 when the cycle λ is 3.3h. Therefore, "wiggling" tends to occur at the cycle λ of 3.3h.

When L is as small as 0.5h, possible values of λ are h, h/2, h/3, and so on, and possible values of λ/h are 1, ½, ⅓, and so on. Referring to the relation of FIG. 6, a range that k may take is toward left with respect to λ/h=1, and k becomes minimum when λ/h is 1, namely when the cycle λ is equal to h. According to the relation shown in FIG. 6, k becomes 4.0 here. This value k is large as to be about 3.6 times of the case of L=1.65h. Considering the buckling occurrence condition of Equation 1, when the value of the pattern length is reduced from 1.65h to 0.5h, the stress required for buckling to occur increases to 3.6 times. That is to say, buckling does not occur easily.

Therefore, it was found that "wiggling" due to buckling can be suppressed by reducing the size of the pattern length L to become smaller than 1.65 times of the pattern height h.

Incidentally, this embodiment was described referring to a single line pattern, but the buckling generation mechanism is common to the micro-fabrication process of a mode to form a line-and-space-like pattern by separating a planar multi-layered film by etching. Therefore, it is needless to say that finding of this embodiment can be applied to the above-described micro-fabrication process in general.

Second Embodiment

With this embodiment an example is described in which "wiggling" due to buckling is suppressed by applying the method described in the first embodiment to the 3D-NAND manufacturing process.

Figure 7:
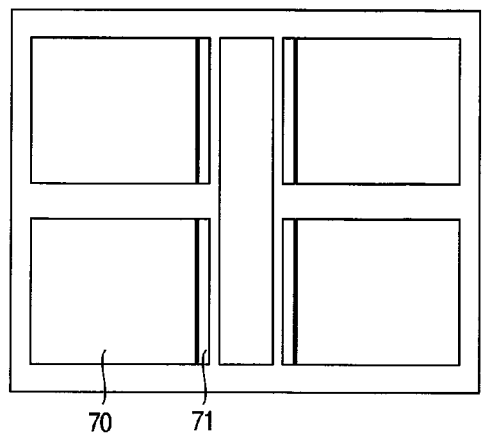
FIG. 7 shows a die of a 3D-NAND flash memory with the memory cells according to a second embodiment formed.

FIG. 7 shows an appearance view of a die forming a 3D-NAND of this embodiment. The die shown in FIG. 7 has a structure that four sets of a memory cell 70 and a peripheral circuit 71 of the 3D-NAND are integrated. The structure of each memory cell is substantially the same as that of the memory cell shown in FIG. 1, but the aspect ratio of the control gate group 31 is defined to be a value with which buckling does not occur easily.

Next, the structure of the 3D-NAND having the occurrence of buckling and the structure of the 3D-NAND in which buckling does not occur are described in comparison with each other. As described above, buckling occurs when a multi-layered film of $Si_3N_4$ films 2 and $SiO_2$ films 3 is etched to separate and form the line-and-space pattern by forming trenches 32; therefore, a process of forming the line-and-space pattern is first described in detail.

Figure 9:
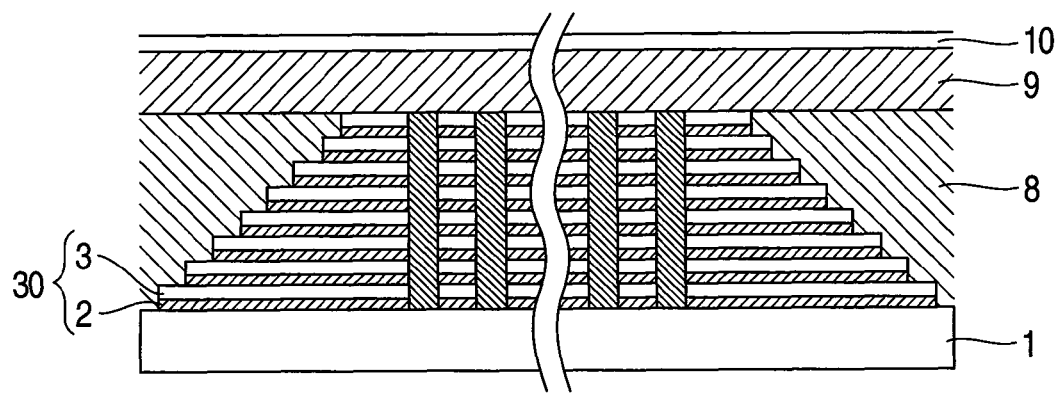
FIGS. 9, 10, and 11 are front views illustrating a process of fabricating a multi-layered film in the memory cell according to the second embodiment into lines and spaces.
Figure 10:
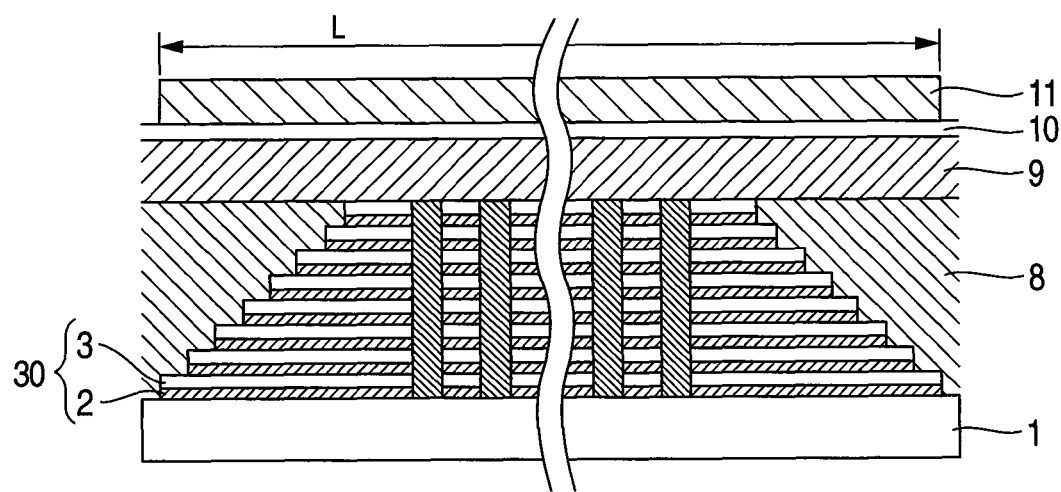
Figure 11:
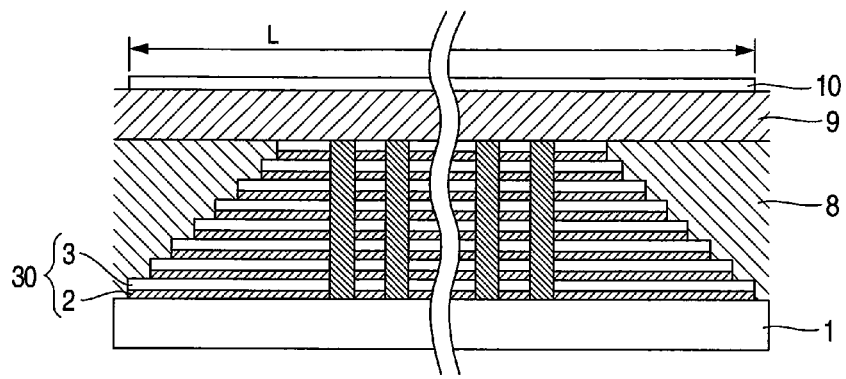

FIGS. 8A to 13C are views illustrating the process of forming the line-and-space pattern. FIGS. 8A to 8C are views showing the memory cell in the state shown in Part (A) of FIG. 2, and FIGS. 13A to 13C are views showing the memory cell in the state shown in Part (B) of FIG. 2, namely the memory cell after etching. Besides, to prevent complication of the drawings, FIG. 9 to FIG. 11 show cross-sectional views only of the multi-layered film of the $Si_3N_4$ films and the $SiO_2$ films viewed in the x direction, and FIGS. 12A to 12C showing a state just before etching are shown in various views.

FIG. 8C shows a front view of a multi-layered film with the control gate layer 30 consisting of the $Si_3N_4$ film 2 and the $SiO_2$ film 3 further stacked 34 times on the Si substrate 1 (namely, the $Si_3N_4$ films 2 and the $SiO_2$ films 3 are 34 layers, respectively, to form a multi-layered film of a total of 68 layers). Each of the $Si_3N_4$ films 2 and the $SiO_2$ films 3 has a thickness of 30 nm, and a total film thickness is about 2 μm.

For convenience of drawing preparation, incidentally, cross-sectional views of 8 layers in the number of stacks are described; samples with the total number of 68 layers were actually prepared and experiments were performed. Within this structure, the channel holes 4 are formed, and their insides are filled with polysilicon. A length in the word line direction (the y direction in this embodiment) of the $Si_3N_4$ film 2 of the lowermost layer is indicated by L, and a height of the control gate group 31 is indicated by h. It should be noted that for convenience of illustration, the Si substrate 1 is shown only partly, but the Si substrate actually extends from front to back and from side to side on the sheet.

Figure 12A:
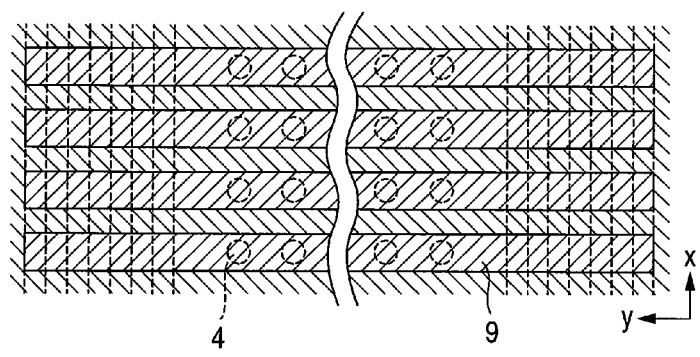
FIGS. 12A, 12B, and 12C are a top view, a side view, and a front view illustrating a process of fabricating the multi-layered film in the memory cell according to the second embodiment into lines and spaces, respectively.
Figure 12B:
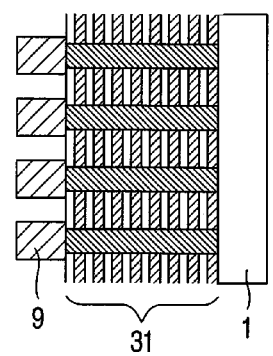
Figure 12C:
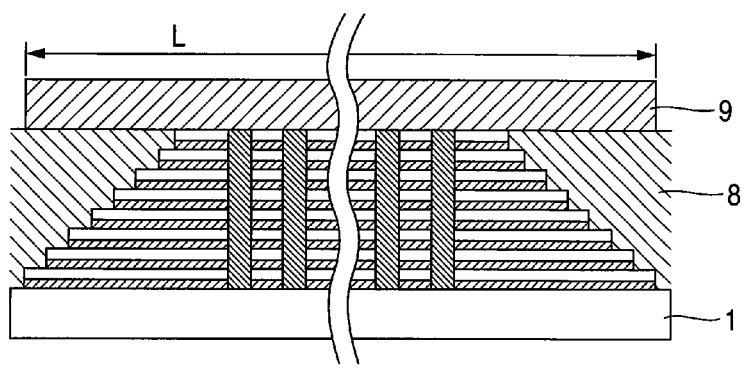

First, in the above structure, portions having nothing on the top of a stepwise structure are covered with an $SiO_2$ film 8 of an interlayer insulating material as shown in FIG. 8A or FIG. 8C. Subsequently, on the above sample, an amorphous carbon (a-C) film 9 having a thickness of 1 μm and an SiON film 10 having a thickness of 100 nm are sequentially stacked by CVD (Chemical Vapor Deposition) (FIG. 9). In addition, a line-and-space-shaped resist mask 11 having a line width of 50 nm and a space width of 50 nm as shown in FIG. 10 is formed thereon by a nanoimprint method having less LER (Line Edge Roughness). In a later-stage etching process, it is necessary to perform line division down to the $Si_3N_4$ film 2 of the lowermost layer, so that the line pattern must have a length the same as or larger than a length L in the y direction of the $Si_3N_4$ film 2 of the lowermost layer. In this embodiment, a resist pattern having the length L was formed. The SiON film 10 is etched along the formed resist mask 11 to form a SiON mask (FIG. 11). Similarly, the a-C film 9 is etched along the formed SiON mask to form an a-C mask. FIGS. 12A to 12C show a top view, a side view, and a front view, respectively, of the memory cell having the a-C mask formed. As it can be seen by comparing FIG. 12A and FIG. 12B, the a-C mask is formed on the channel holes 4 and a pattern of lines and spaces extending in the y direction is formed. The finally formed a-C mask has a thickness of 1 μm, and the line width and the space width are 50 nm, respectively.

Figure 13A:
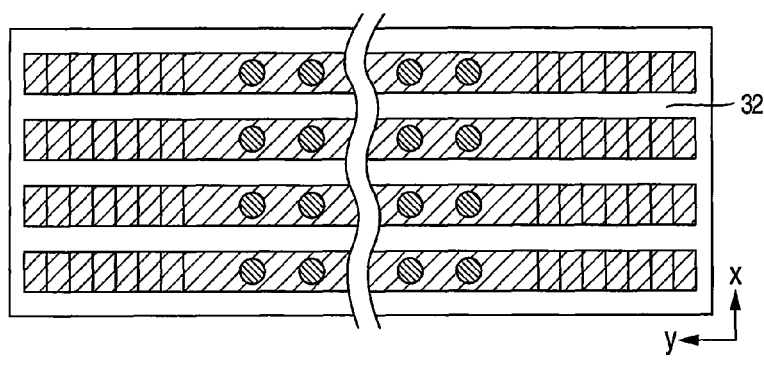
FIGS. 13A, 13B, and 13C are a top view, a side view, and a front view illustrating a process of fabricating the multi-layered film in the memory cell according to the second embodiment into lines and spaces, respectively.
Figure 13B:
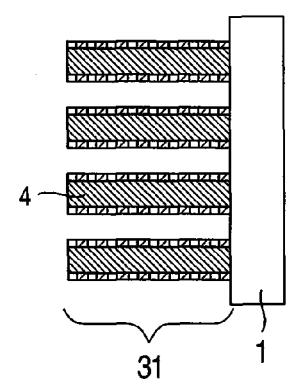
Figure 13C:
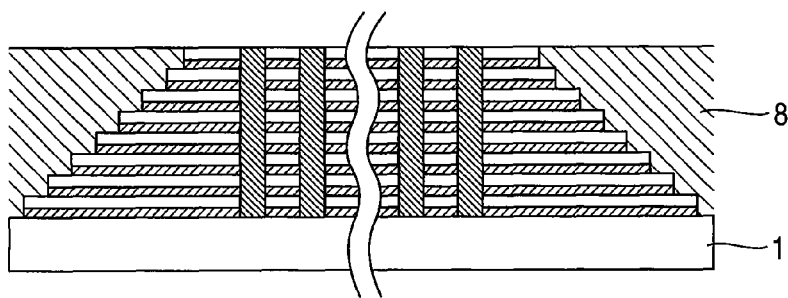

Finally, the multi-layered film of the $Si_3N_4$ films 2 and the $SiO_2$ films 3 is thoroughly plasma etched along the above-described a-C mask. Thus, the trenches 32 are formed in the multi-layered film to separate and form control gate groups 31 of the shape of the line-and-space pattern (FIG. 13). A maximum longitudinal length of the control gate groups 31, namely a length in the longitudinal direction of the control gate layer 30 as the lowermost layer of the stepwise structure, is L, and a width of the control gate groups 31, namely a length in the direction separated by the trenches, is w. It is seen from FIG. 1C that the word lines 34 are formed in parallel in the above longitudinal direction, and the bit lines 33 are formed in parallel in the above width direction. It is seen by comparing FIGS. 13A to 13C that the trenches 32 just after etching between the control gate groups 31 are not filled with anything but it is in a self-standing state by virtue of rigidity only of the multi-layered film (the top of the stepwise structure is covered with the $SiO_2$ film 8 of an interlayer insulating material).

Using the above process, two samples, having the control gate groups 31 with a length L of 6.6 μm and 440 nm, were prepared and tested whether buckling occurred.

The length L of 6.6 μm is a multiple of 1.65 times of the final pattern height of 2 μm, namely 3.3 μm, and it is presumed from consideration of the first embodiment that buckling is very likely to occur while 440 nm is smaller than 3.3 μm and it is presumed that buckling does not occur easily.

Figure 14A:
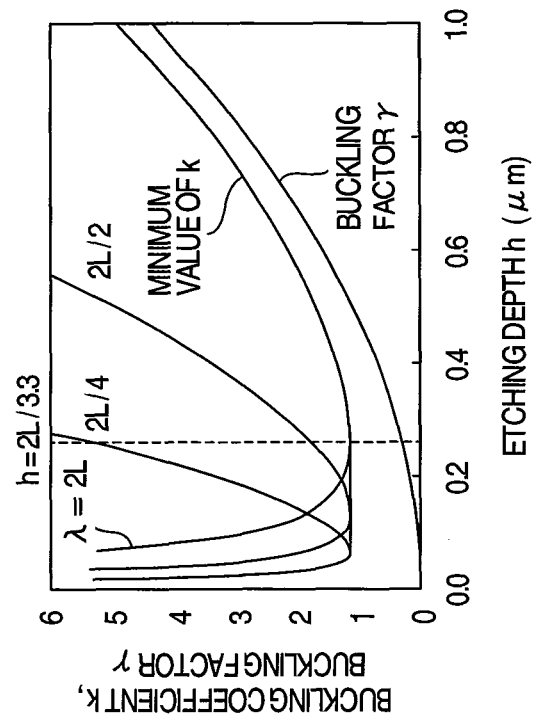
FIGS. 14A and 14B are graphs showing relations of an amorphous-carbon (a-C) etching depth with a buckling coefficient and a buckling factor in the memory cell according to the second embodiment.

The sample having a length L of 6.6 μm had "wiggling" when the a-C film 9 was etched to a depth of 500 nm by the process of FIGS. 12A to 12C. In this connection, relations of the buckling coefficients k calculated with respect to several possible kinds of buckling cycles λ=2L/n and the etching depth h, along with the minimum value of the buckling coefficients k, and the relations of the value of the buckling factor γ and the etching depth h were calculated, and the results are shown in FIG. 14A. Since the length L is long as 6.6 μm, the buckling cycle λ can have various values of 13.2 μm and below. Therefore, the minimum value of the buckling coefficient k is 1.1 and does not change substantially. On the other hand, the buckling factor γ increases in proportion to a square of the etching depth h. And, when the etching depth reaches 500 nm, the buckling factor γ becomes larger than the minimum value of the buckling coefficient k. At this time, the a-C film 9 becomes a pattern having an aspect ratio 10 of a height h of 500 nm and a width w of 50 nm. And, the a-C used in this study has a residual stress σ corresponding to 1.2% of Young's modulus E, so that the buckling factor γ becomes 1.2. At this point, since the buckling factor γ becomes larger than the buckling coefficient k, it is considered that "wiggling" was caused due to buckling.

Figure 14B:
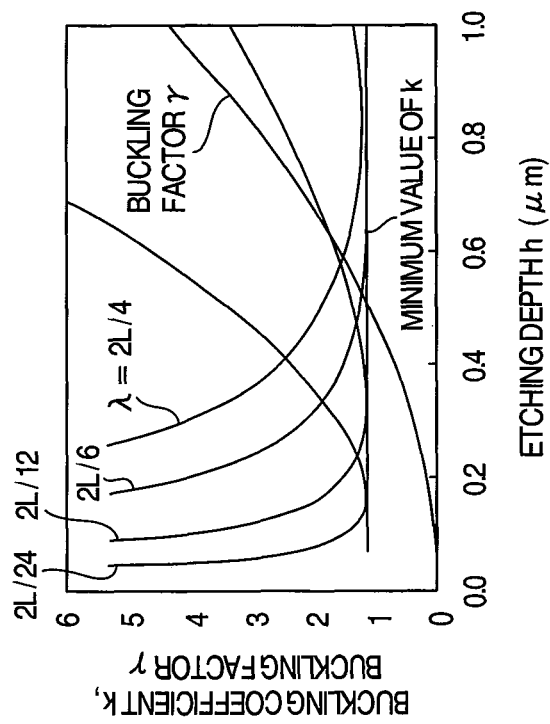

Subsequently, the test results on the sample having a length L of 440 nm are described below. The results are good, and "wiggling" was not caused by buckling even if etching was performed to reach the bottom of the a-C film 9. In this connection, calculation was made for the relation between the buckling coefficients k calculated with respect to the several possible types of buckling cycles λ=2L/n and the etching depth h along with the minimum value of the buckling coefficients k, and for the relation of the value of the buckling factor γ and the etching depth h, and the calculated results are shown in FIG. 14B. The length L set in this experiment is short and 440 nm. Therefore, the buckling cycle λ is limited to 2L, namely a value of 0.88 μm or less. Thus, when the etching depth h is 266 nm or more with which 2L/h becomes 3.3, the minimum value of the buckling coefficient k increases. Accordingly, with the etching depth of 500 nm when the buckling factor γ exceeds 1.1, namely with the aspect ratio 10, the buckling factor γ is smaller than the buckling coefficient k, and "wiggling" by buckling is not caused.

That is to say, when the process of halfway of the etching is considered, in order to prevent buckling, $h_1 > h_0$ must be satisfied where the etching depth $h_1$ corresponding to the aspect ratio of 10 when the buckling factor γ becomes around 1.1 is compared with $h_0$ satisfying $2L/h_0=3.3$. In other words, the length L of the pattern must be smaller than 16.5 times of the width w.

Figure 15A:
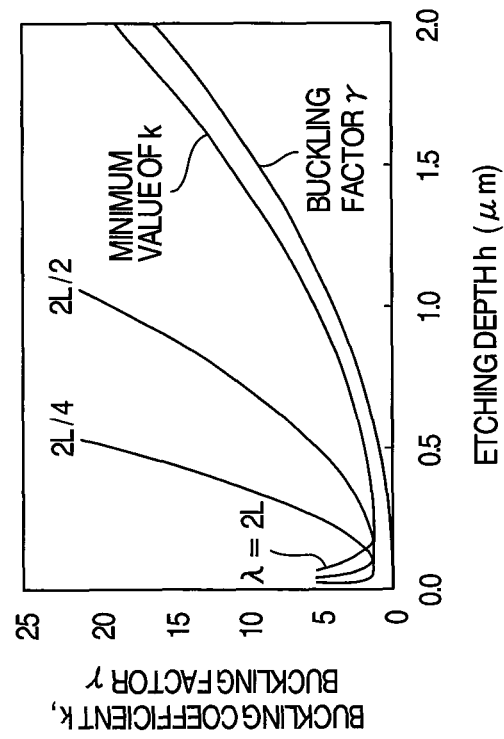
FIGS. 15A and 15B are graphs showing relations of an etching depth of the multi-layered film with a buckling coefficient and a buckling factor in the memory cell according to the second embodiment.
Figure 15B:
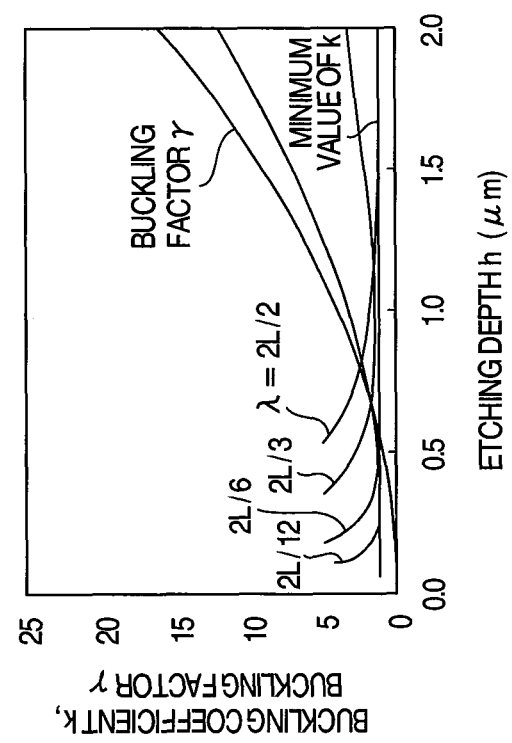

Subsequently, the a-C mask prepared by the above test was used to etch the multi-layered film of the $Si_3N_4$ films and the $SiO_2$ films therebelow. FIG. 15B shows relations of the etching depth of the multi-layered film with the buckling factor γ and the minimum value of the buckling coefficient k. Respective residual stresses of the $Si_3N_4$ film and the $SiO_2$ film are 1.0% of Young's moduli. The abscissa of the graph is set to have a range of 0 to 2 μm which is a thickness of the multi-layered film. The value of the buckling factor γ increases in proportion to a square of the height. On the other hand, the minimum value of the buckling coefficient k increases when the etching depth h is 266 nm or more similar to the case of FIG. 14B. Therefore, since the value of the buckling factor γ is always smaller than the minimum value of the buckling coefficient k in the range of 0 to 2 μm, it is perceived that "wiggling" by buckling is not caused, and buckling did not occur while the multi-layered film was etched in the actual test.

The same evaluation was performed next using a spin-coated film of an organic material (Spin-on Carbon, SOC) with a less residual stress instead of the a-C. The prepared samples are the two with the lengths L of the control gate groups 31 of 6.6 μm and 440 nm similar to the case having the mask of a-C. Besides, it was set that the SOC mask had a thickness of 1 μm, and the line width and the space width were 50 nm, respectively. The SOC has a residual stress σ corresponding to only 0.16% of Young's modulus E. Therefore, even when the SOC mask was etched by 1 μm so as to have an aspect ratio of 20, the buckling factor γ was 0.64 and smaller than the minimum value 1.1 of the buckling coefficient k. Therefore, both samples having the lengths L of 6.6 μm and 440 nm, respectively, did not have "wiggling" due to buckling.

Next, using this SOC mask, the multi-layered film of the $Si_3N_4$ films and the $SiO_2$ films was etched by the procedure shown in FIGS. 13A, 13B, and 13C. The sample having the length L of 6.6 μm had "wiggling" when the multi-layered film was etched to a depth of 550 nm. In this connection, calculation was made for the relation between the buckling coefficients k calculated with respect to several possible types of buckling cycles λ=2L/n and the etching depth h, along with the minimum value of the buckling coefficients k, and for the relation of the value of the buckling factor γ and the etching depth h, and the calculated results are shown in FIG. 15A. The length L set in this experiment is 6.6 μm and long. Therefore, the etching depth with which the above described 2L/h becomes 3.3 is large as 4.0 μm. Thus, the minimum value of the buckling coefficient k between 0 and 2 μm is 1.1 and substantially constant. On the other hand, the buckling factor γ increases in proportion to a square of the etching depth h. And, when the etching depth reaches 550 nm, the buckling factor γ becomes larger than the minimum value of the buckling coefficient k. The aspect ratio here is 11. Moreover, when it is considered that the residual stress σ of the multi-layered film is about 1.0% of Young's moduli E of the $Si_3N_4$ films and the $SiO_2$ films, the buckling factor γ at that time is 1.21. Thus, it is speculated that the buckling factor exceeds the buckling coefficient at this time of point, and "wiggling" was caused by buckling.

On the other hand, the sample having the length L of 440 nm did not have occurrence of "wiggling" due to buckling. Since the pattern length is 440 nm, the dependence of the minimum value of the buckling coefficient k and the buckling factor γ on the etching depth h is in this case the same as in FIG. 15B. Therefore, since the value of the buckling factor γ is always smaller than the minimum value of the buckling coefficient k in the range of the etching depth of 0 to 2 μm, buckling does not occur.

Figure 16:
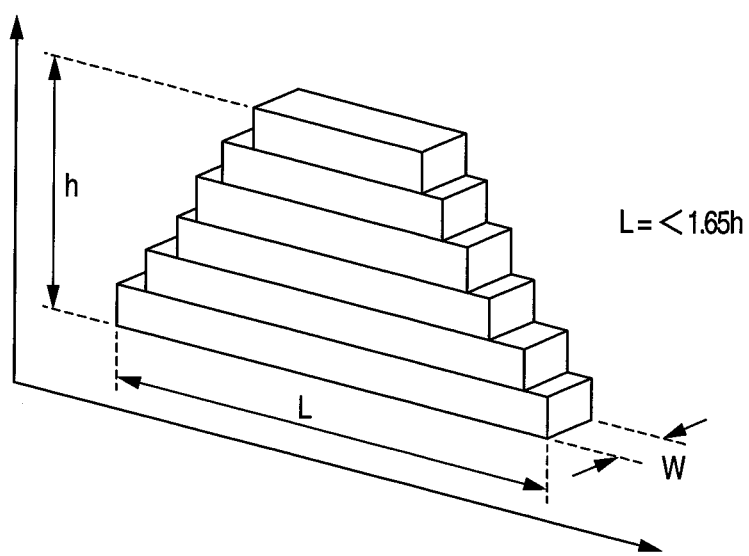
FIG. 16 is a perspective view showing a structure of a control gate group of the memory cell according to the second embodiment.

As described above, as for the multi-layered film having a residual stress corresponding to about several percent of the Young's modulus E, when an aspect ratio becomes large (for example, 10 or more), there is a possibility that "wiggling" by buckling occurs. As measures against the above, it is effective to reduce the length L of the line pattern of the mask, and its value is required to be at least 1.65 times or less of the thickness h of the material to be etched. That is to say, a mask pattern having a length of 1.65 times or less of the length of the bottom surface of the multi-layered film is formed on the top of the multi-layered film, and when it is used as a mask to perform etching, "wiggling" can be suppressed from occurring on the multi-layered film. FIG. 16 shows a perspective view of the control gate group of this embodiment in which the aspect ratio is defined as described above. In the 3D-NAND described in this embodiment the control gate group shown in FIG. 16 is formed in plural within the memory cell, and a structure in which "wiggling" is suppressed from occurring is provided.

Also in this embodiment, a comparative experiment is performed under a condition where the film thickness of each control gate layer 30 and the number of stacks configuring the control gate group 31 are kept constant and the length of the lowermost layer (namely, L) is adjusted; however, it is needless to say that the same results can be obtained by performing the comparative experiment with the L kept constant and the height of the control gate group 31 (namely, the film thickness of the control gate layer 30 or the number of stacks) varied.

Further, considering the etching progress, it is desirable that the length L of the line pattern is set to be 1.65 times or less of the etching depth with which the aspect ratio (h/w) becomes 10. In this case, h/w is 10 and, because L is smaller than 1.65h, it is desirable that L is smaller than 16.5w, namely it is less than 16.5 times of the pattern width w.

Besides, when the length L of the line pattern is determined to be 16.5 times or less of the pattern width w, there is a chance when the number of the channel holes 4 to be connected to one gate electrode 5 might become smaller than the desired number; in such a case, however, the number of the channel holes 4 to be connected to one gate electrode 5 can be increased by increasing the pattern width w of the multi-layered film and arranging the channel holes in plural rows as shown in, for example, FIG. 17A and FIG. 17B.

As above in this embodiment, a method of suppressing "wiggling" from occurring by setting the etching depth or the length of the bottom surface of the multi-layered film in a prescribed range and setting the aspect ratio to a value with which buckling does not occur easily is described. The residual stress of the multi-layered film is particularly large in the film formed by CVD, so that the method of this embodiment is particularly effective for the multi-layered film formed by CVD; it is also effective, however, for a single layer film or the film formed by other film forming methods (for example, a sputtering method). And, the multi-layered film which operates as an active element such as the control gate group is often formed by stacking conductive films and insulating films, and such a multi-layered film is often formed by CVD. Therefore, the "wiggling" suppressing method of this embodiment may also be said to be particularly effective for etching of the multi-layered film for configuring a plurality of active elements.

Third Embodiment

Figure 18A:
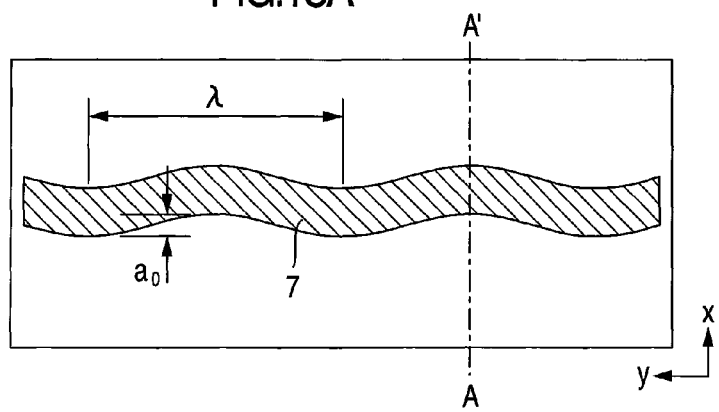
FIGS. 18A and 18B show an example of a line pattern having initial waviness.
Figure 18B:
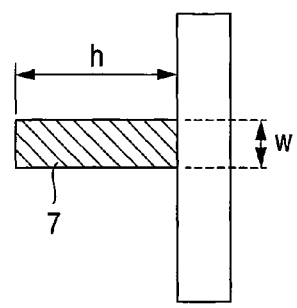

In this embodiment, a waviness amplification phenomenon which is another "wiggling" mechanism and a principle for suppressing waviness amplification are described. A mask formed by lithography has a defect which is called Line-Edge-Roughness (LER) and has a characteristic that the line pattern mask waves by about several nanometers. The phenomenon that large "wiggling" is caused to occur by the waviness is a waviness amplification phenomenon. For example, it is assumed that there is a line pattern 7 waving in right and left sinusoidally with a cycle λ as shown in FIG. 18A. FIG. 18B shows a cross-sectional view taken along the line A-A' of FIG. 18A, and in this state, it is self-standing without falling. Letting the amplitude of a sine wave representing waviness virtually be $a_0/2$, the position coordinate of this pattern is expressed by the following expression.

[MATH. 3]

$$x = \frac{a_0}{2} \sin\left(\frac{y}{\lambda}\right) \quad (3)$$

When the material forming the pattern has a residual stress σ, a force F that deforms the pattern in the x direction is generated. The value of this force F is expressed by the following expression.

[MATH. 4]

$$F \propto \sigma \frac{d^2 x}{dy^2} = \frac{a_0 \sigma}{2\lambda^2} \sin\left(\frac{y}{\lambda}\right) \quad (4)$$

Figure 19A:
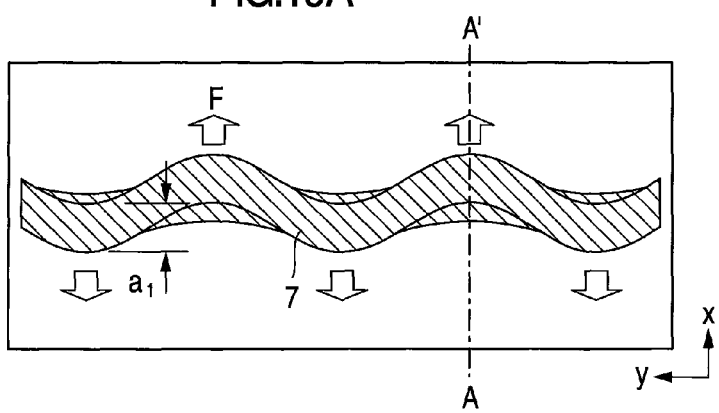
FIGS. 19A and 19B show a line pattern after waviness amplification.
Figure 19B:
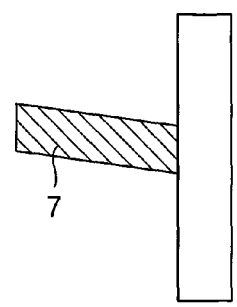

Namely, there is generated a force F that deforms the pattern in a direction to amplify the waviness. Therefore, when the pattern of FIG. 18 has a residual stress σ, the pattern is deformed in the direction that the waviness is amplified as shown in FIG. 19A and falls as shown in FIG. 19B. Letting the amplitude of the waviness after deformation be $a_1/2$, a relation between the waviness amplitude $a_0$ before deformation and $a_1$ is expressed by the following expression.

[MATH. 5]

$$A \equiv \frac{a_1}{a_o} = \frac{1.5\gamma}{k-\gamma} + 1. \quad (5)$$

where A is a waviness amplification factor.

This amplification factor A becomes larger than 1 even if the buckling factor γ and the buckling coefficient k satisfy a condition where buckling does not occur. That is to say, the waviness amplification phenomenon might occur even under conditions including a very small stress which does not cause buckling and a low aspect ratio.

[MATH. 6]

$$k-\gamma>0 \quad (6)$$

Figure 20:
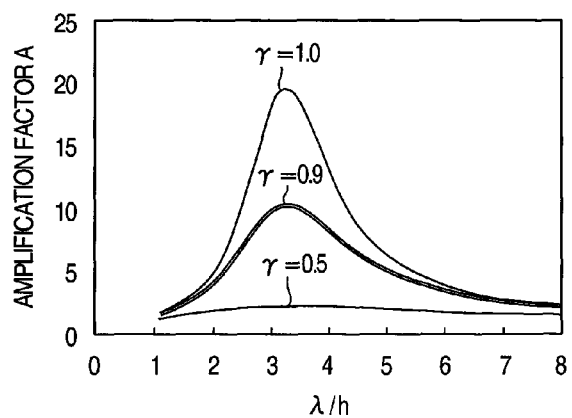
FIG. 20 shows a relation between a cycle of an initial waviness and a waviness amplification factor.

Also as shown in FIG. 20, the amplification factor A becomes large when the aspect ratio or the residual stress is high so that the value of γ is large or when the initial waviness cycle is close to λ/h and the value of k becomes small.

To suppress the above waviness amplification phenomenon, the initial waviness amplitude $a_0/2$ must be reduced by suppressing LER, or λ must be reduced by lowering the aspect ratio and the residual stress. However, it is hard to realize in reality.

Therefore, a structure which does not affect the device properties even if waviness amplification occurs was studied. When the waviness amplification phenomenon occurs, the force F acts on the portion in which the second-order derivative of the waviness is large as described above to deform it largely. Conversely, the force F is not produced substantially in a portion in which the second-order derivative of the waviness becomes zero and deformation does not occur.

Figure 21A:
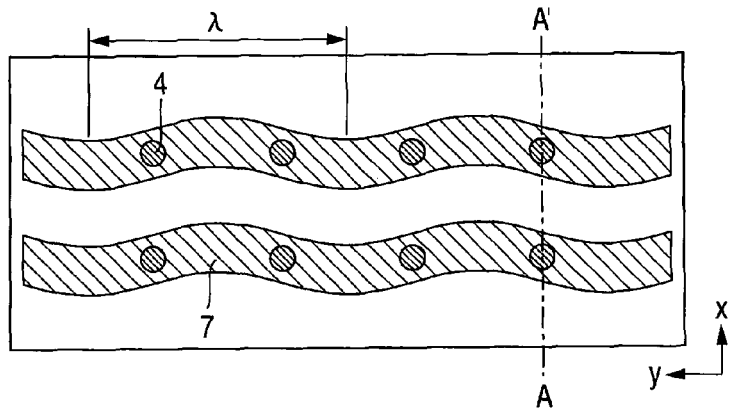
FIGS. 21A and 21B are schematic views showing a countermeasure against waviness amplification according to a third embodiment.
Figure 21B:
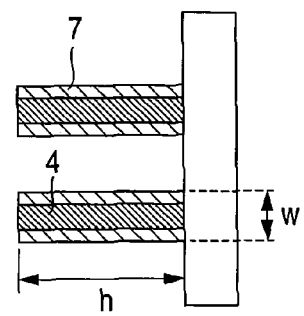
Figure 22A:
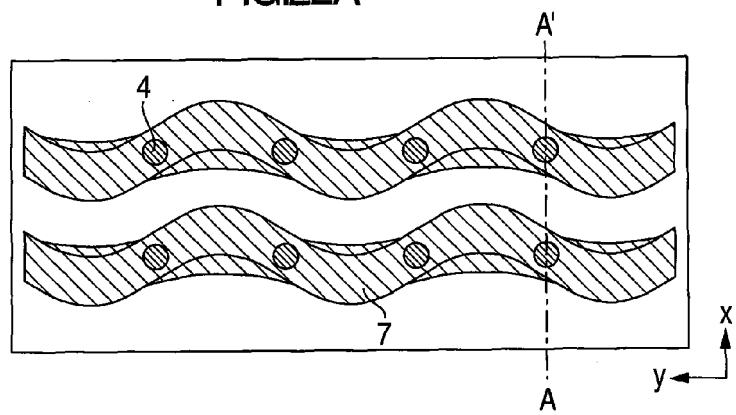
FIGS. 22A and 22B are schematic views showing a deformation of the line pattern provided with the countermeasure against waviness amplification according to the third embodiment.
Figure 22B:
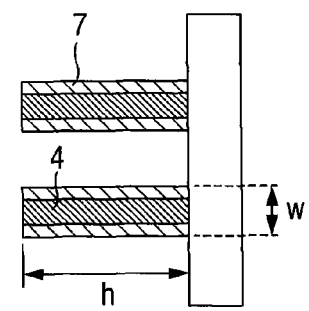

Therefore, as measures, as shown in FIG. 21A, for example, a method can be conceived that allows adjacent patterns 7 to wave in a sine wave form with the same cycle and the same phase, and forms channel holes 4 which affects the device performances at positions where the second-order derivative of the waviness becomes zero, namely positions of inflection points of the waviness. In this case, even when the waviness amplification occurs, any problems such as deterioration in properties due to a stress or a failure of connection with contact holes due to displacements of the positions of the channel holes 4 from the design values would not arise because the positions where the channel holes 4 are formed do not deform substantially as shown in FIG. 22A. FIG. 22B shows a cross-sectional view taken along the line A-A' of FIG. 22A, and it is seen that the insides of the channel holes 4 are not deformed particularly. Also, an amount of deformation increases at a portion where the second-order derivative is large, but since the adjacent patterns 7 are deformed in the same direction, they do not electrically short-circuited by contacting with each other.

Forth Embodiment

In this embodiment, an example of forming a 3D-NAND having a structure not affecting the device properties even when waviness amplification occurs by applying the method described in the third embodiment to a 3D-NAND manufacturing process is described.

In this embodiment, a 3D-NAND memory cell having the structure to suppress the waviness amplification from occurring described in the third embodiment, and another 3D-NAND memory cell not having the above structure were prepared for comparison. The 3D-NAND memory cell not having the structure to suppress the waviness amplification from occurring was formed by the same process as in the second embodiment, and the pattern length L was set to be 440 nm in order to suppress buckling from occurring. As a difference in the manufacturing process from the second embodiment, for the memory cell of this embodiment, the resist mask 11 was formed not by the nanoimprint of the second embodiment (see the description of FIG. 10) but by an ordinary lithography technology. The resist mask 11 formed by the ordinary lithography is known to have waviness of a cycle of 880 nm and an amplitude of around 1 nm in an irregular phase due to LER. Similar to the second embodiment, SiON and a-C are sequentially etched along the resist mask 11, and at last the multi-layered film of the $Si_3N_4$ films 2 and the $SiO_2$ films 3 is thoroughly etched.

As a result, irregular "wiggling" occurred due to waviness amplification in the a-C etching process (see the description of FIG. 13).

Figure 23:
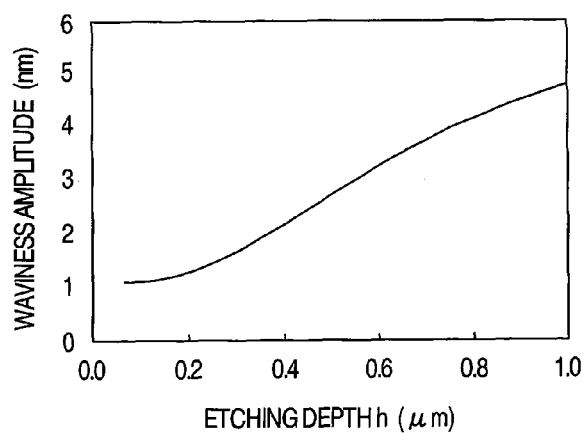
FIG. 23 is a graph showing a relation between an etching depth and a waviness amplitude of a mask material (a-C) when the mask material is etched in the presence of waviness.
Figure 24A:
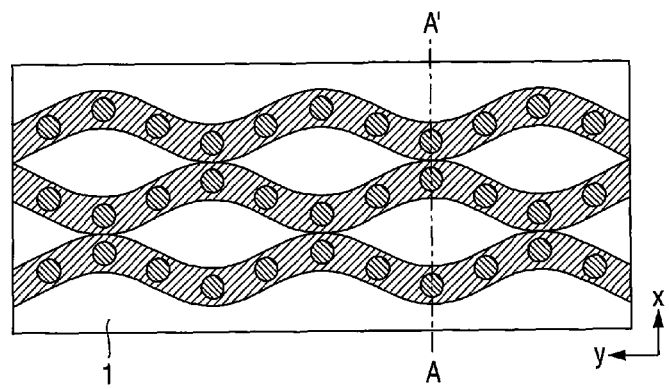
FIG. 24A is a schematic view showing a control gate group of a 3D-NAND suffering from a processing failure due to "wiggling"
Figure 24B:
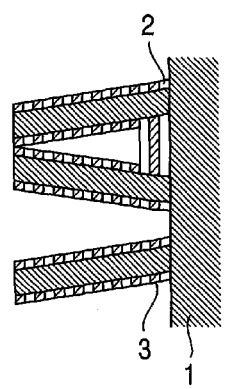
FIG. 24B is a cross-sectional view taken along the line A-A' of FIG. 24A.

FIG. 23 shows a relation between the waviness amplitude and the a-C etching depth. The waviness amplitude increased gradually with the progress of etching (the etching depth) and, when 1.0-μm etching was completed, waviness with an amplitude of 4.7 nm had occurred. That is to say, the a-C mask had the generation of LER with an amplitude of 4.7 nm. In addition, as a result of etching of the multi-layered film explained referring to FIG. 13 using the a-C mask, "wiggling" increased further and adjacent patterns were caused to partially touch with each other as shown in FIG. 24A. Moreover, etching of the multi-layered film was stopped on the way at the touched portions as shown in FIG. 24B.

Figure 25:
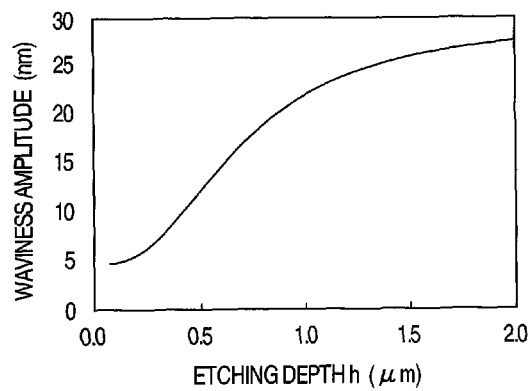
FIG. 25 shows a relation between the etching depth and the waviness amplitude of the multi-layered film of the control gate group of the 3D-NAND suffering from the processing failure shown in FIGS. 24A and 24B.

FIG. 25 shows a relation between the waviness amplitude and the etching depth during etching of the multi-layered film. The waviness amplitude increased gradually with the progress of etching (the depth), and when the etching reached 2.0 μm, which is equal to the thickness of the multi-layered film, waviness having an amplitude of 27 nm, which is an amplitude of 5.7 times of the waviness generated in the a-C mask, had arisen. By this, it is presumed that the adjacent patterns touched partially with each other.

Figure 26A:
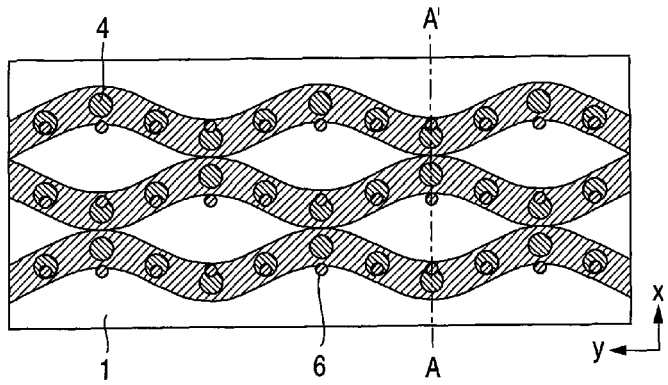
FIG. 26A is a top view schematically showing a 3D-NAND memory cell suffering from a wire connection failure.
Figure 26B:
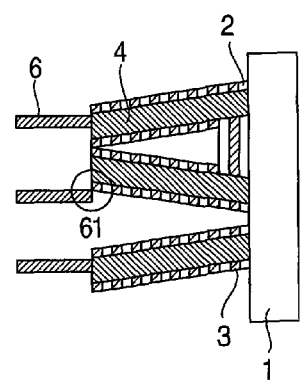
FIG. 26B is a cross-sectional view taken along the line A-A' of FIG. 26A.

In addition, it was found that a connection failure has occurred in the process of connecting the contact holes 6 which become wiring onto the channel holes 4. FIGS. 26A and 26B show a schematic of a portion of a connection failure. FIG. 26A is a top view of the control gate group having a connection failure, and it is seen that the contact holes 6 are partly displaced from the centers of the channel holes 4 which are at original forming positions. FIG. 26B is a cross-sectional view taken along the line A-A' of FIG. 26A, and it is seen that a connection failure has occurred between the contact hole 6 and the channel hole 4 at a defective portion 61. It was because "wiggling" was so increased that the channel hole 4 was considerably displaced from the original design position when it was formed.

Next, a manufacturing process for a 3D-NAND memory cell having a structure for suppressing waviness amplification from occurring and a device structure are described below.

Figure 27A:
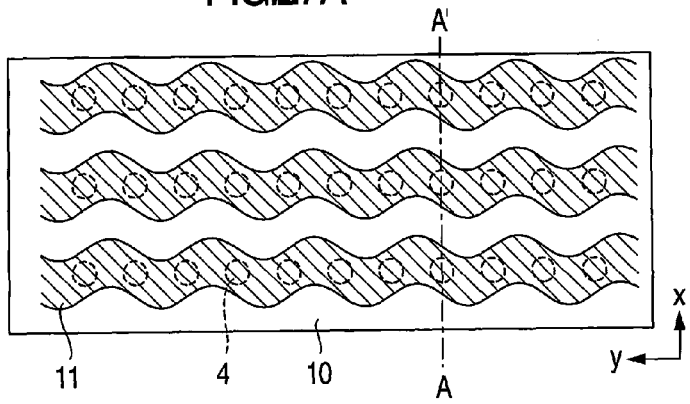
FIGS. 27A and 27B are a top view and a side view showing a resist mask layout according to a fourth embodiment.
Figure 27B:
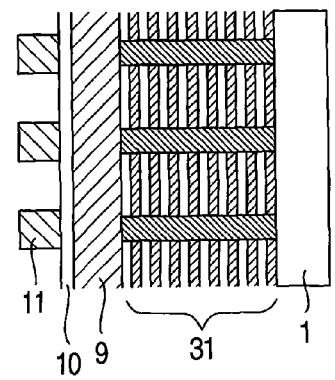

First, formation of a control gate layer comprising a multi-layered film of $Si_3N_4$ films 2 and $SiO_2$ films 3 on a Si substrate and etching are performed subsequently to form the structure shown in FIG. 9. It is assumed that the length L of the bottom surface of the multi-layered film and the height h of the multi-layered film are set to be values not causing buckling. A resist mask pattern 11 is then formed on the a-C film; at this time, a sinusoidal pattern is formed rather than the pattern of the line-and-space pattern described in the second embodiment. In this embodiment, a sine wave cycle was set to 200 nm which is twice of a pitch of 100 nm of the channel holes 4, and the amplitude was set to 50 nm, respectively, and the phase was matched so that the positions of the channel holes 4 become positions where the second-order derivative of the sine wave becomes zero (the positions of the inflection points). FIG. 27A shows a top view of the sinusoidal resist pattern formed in this embodiment, and FIG. 27B shows a cross-sectional view taken along the line A-A' of FIG. 27A, respectively.

When the a-C film was etched using the formed resist mask 11, the amplitude increased slightly, but the mask was not displaced substantially at positions where the second-order derivative of the waviness becomes zero, namely the positions of the channel holes 4.

Figure 28:
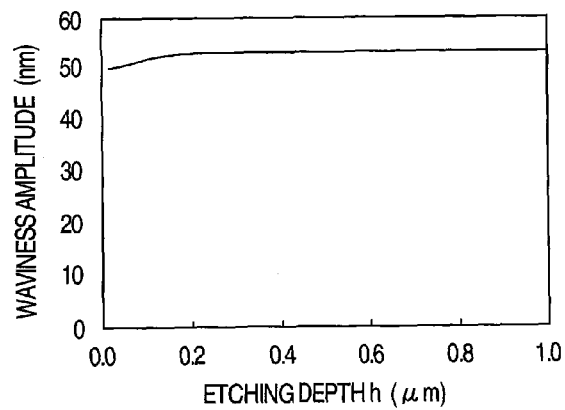
FIG. 28 shows a relation between an etching depth and a waviness amplitude of the a-C according to the fourth embodiment.

FIG. 28 shows a relation between the amplitude of waviness having a cycle of 200 nm and the a-C etching depth.

The waviness amplitude increases from the initial value of 50 nm given as sine wave amplitude to the value of 53 nm at an etching depth of 100 nm with the progress of etching, but an increase does not proceed substantially after that. Also, waviness with a cycle of 880 nm due to LER was not amplified substantially. It is presumed that the waviness of a long cycle due to LER was not amplified because the stress was relaxed by an increase of the waviness amplitude of a short cycle (200 nm in this embodiment) in an early stage of etching.

Figure 29A:
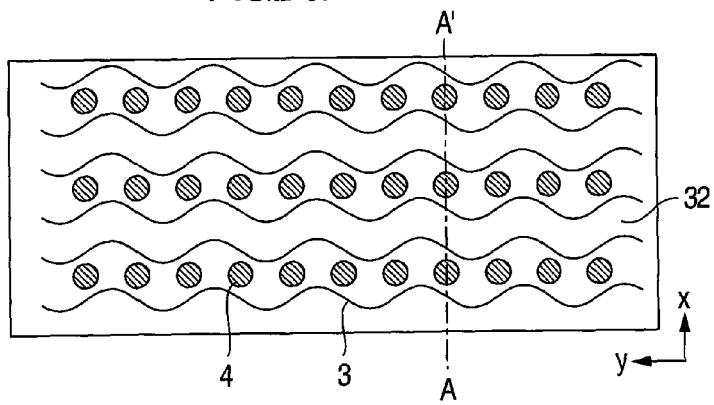
FIGS. 29A and 29B show a fabricated shape resulting from etching of the multi-layered film according to the fourth embodiment.
Figure 29B:
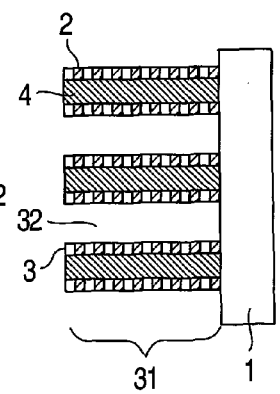

Using the a-C mask formed by the above procedure, the terrace-shaped multi-layered film shown in FIG. 12 was etched. As a result, waviness was further increased slightly, but the adjacent patterns were suppressed from adhering with each other because they were deformed in the same direction as shown in FIGS. 29A and 29B. Also similar to the a-C etching, the pattern was not deformed substantially at positions where the second-order derivative of waviness becomes zero, namely the channel hole positions.

Figure 30:
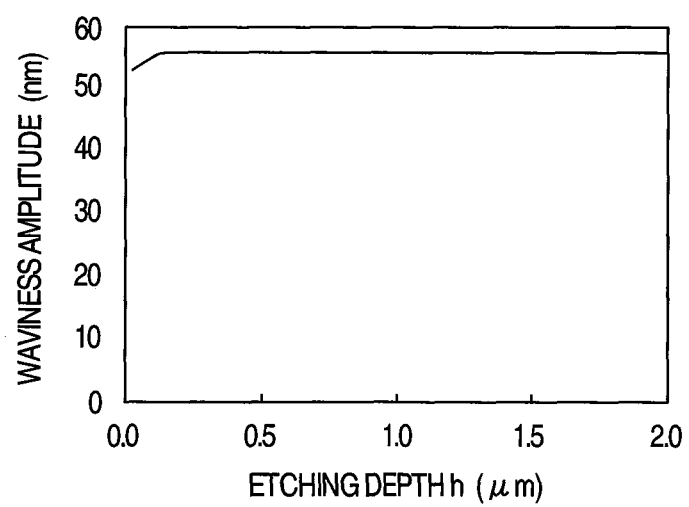
FIG. 30 shows a relation between the etching depth and the waviness amplitude of the a-C according to the fourth embodiment.

FIG. 30 shows a relation between the waviness amplitude and the etching depth when the terrace-shaped multi-layered film was etched. For the waviness of a cycle of 200 nm, the waviness amplitude was increased from an initial value of 53 nm (the waviness amplitude of the a-C mask) to 56 nm (the value when the etching depth was 100 nm) with the progress of etching, but it did not change substantially after that. Also, the waviness of a cycle of 880 nm due to LER was not amplified substantially. In addition, the positions of the channel holes 4 were not displaced, so that the channel holes 4 did not have contact failures with the contact holes 6 at all.

As described above, the problem resulting from "wiggling" can be avoided because the channel hole portions are not deformed when the pattern is originally waved sinusoidally and the channel holes are formed in positions where the second-order derivative of waviness becomes zero. Also, when adjacent patterns are made to have the same phase, the adjacent patterns would not contact to each other even when their falls become large due to "wiggling".

Besides, the resist mask form is not necessarily limited to the sine wave form and may have any form if it is a wave form with which the second-order derivative becomes zero. By waving the resist mask 11 in a zigzag as shown in, for example, FIGS. 31A and 31B and matching the phase so that the positions where the channel holes 4 are formed are matched with the positions where the second-order derivative of waviness becomes zero, the same effect can be obtained.

Figure 32A:
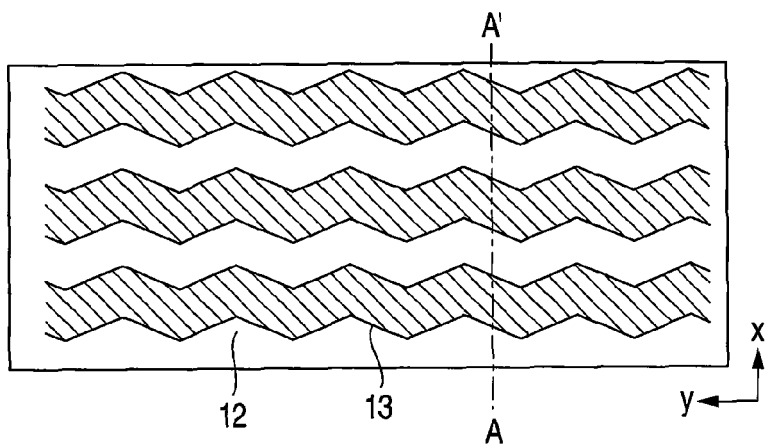
FIGS. 32A and 32B show an example of a layout of the resist mask of the present invention according to the fourth embodiment.
Figure 32B:
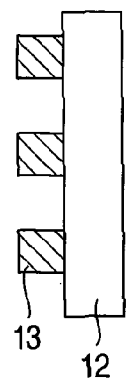

FIGS. 32A and 32B show an example of a reticle for forming the zigzag pattern shown in FIGS. 31A and 31B by lithography. FIGS. 32A and 32B show the reticle for exposure which has a zigzag Ti mask 13 formed on a reticle substrate 12; even this zigzag pattern can suppress the movement of the channel hole positions due to "wiggling". Besides, when the waviness amplitude is close to a minimum exposure dimension, a sinusoidally waving resist mask can be formed naturally by exposing the zigzag pattern.

Fifth Embodiment

The present embodiment relates to semiconductor devices having the following structures:
1) a semiconductor device provided with a semiconductor element which operates as an active element and semiconductor element blocks which are divided from each other by trenches, wherein a ratio obtained by dividing a maximum length in a longitudinal direction of the semiconductor element blocks by its height is defined within a range in which buckling does not occur;
2) a semiconductor device comprising: a plurality of control gate groups which comprise a plurality of contact gate layers stacked and are divided from each other by trenches; channel holes formed in the control gate groups; bit lines connected to the control gate groups via electrodes; and word lines connected to the contact gate layers via contact plugs, wherein the plurality of control gate groups have shapes waving in the same phase as each other, and the channel holes are formed in positions of inflection points of the waving shapes.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device manufacturing method comprising the step of forming a three-dimensional memory cell, the step of forming a three-dimensional memory cell comprising the steps of:
   stacking a plurality of control gate layers, each of which is configured as a multi-layered film of an insulating layer and a conductor layer;
   forming channel holes in the plurality of stacked control gate layers; and
   forming a plurality of control gate groups by forming trenches in the plurality of stacked control gate layers by plasma etching to separate the plurality of stacked control gate layers,
   wherein a length in a longitudinal direction and a height of the control gate groups are determined so that a value obtained by dividing a buckling cycle by the height becomes a value with which buckling does not occur, the buckling cycle being obtained by dividing twice the length by a natural number.

2. The method according to claim 1, wherein a value obtained by dividing the height of the control gate groups by a width in a short-side direction of the control gate groups is 10 or more.

3. The method according to claim 1, wherein the length divided by the height is less than 1.65.

4. The method according to claim 3, wherein a ratio of the length to a width in a short-side direction of the control gate groups defined by the trenches is less than 16.5.

5. The method according to claim 4, wherein a plurality of rows of the channel holes are formed in the control gate groups.

6. The method according to claim 1, wherein:
   the control gate groups are formed to have a stepwise shape in which a length of an upper control gate layer is smaller than a length of a lower control gate layer, and
   length the height of the control gate groups are defined as a length of a lowermost control gate layer of the stepwise shape and an overall height of the stepwise shape, respectively.

7. The method according to claim 1, wherein the step of forming a plurality of control gate groups comprises the steps of:
   forming a line-and-space pattern on the plurality of stacked control gate layers; and
   etching the plurality of stacked control gate layers to the lowermost layer with the line-and-space pattern used as a mask, and
   wherein the line-and-space pattern has a shape in which individual patterns are waving in a same phase as each other and the channel holes are positioned in positions of inflection points of waviness.

8. The method according to claim 1, wherein the value with which buckling does not occur is smaller than 3.3.

9. The method according to claim 2, wherein the value obtained by dividing the height by the width is less than 1.65.

10. A semiconductor device manufacturing method comprising the step of forming a three-dimensional memory cell, the step of forming a three-dimensional memory cell comprising the steps of:
    stacking a plurality of control gate layers, each of which is configured as a multi-layered film of an insulating layer and a conductor layer;
    forming channel holes in the plurality of stacked control gate layers; and
    forming a plurality of control gate groups by forming trenches in the plurality of stacked control gate layers by plasma etching to separate the plurality of stacked control gate layers,
    wherein a length in a longitudinal direction and a height of the control gate groups are determined so that a value obtained by dividing a buckling cycle by the height becomes a value with which buckling does not occur, the buckling cycle being obtained by dividing twice the length by a natural number, and
    wherein the step of forming a plurality of control gate groups comprises the steps of:
    forming a line-and-space pattern on the plurality of stacked control gate layers; and
    etching the plurality of stacked control gate layers to the lowermost layer with the line-and-space pattern used as a mask,
    wherein the line-and-space pattern has a shape in which individual patterns are waving in a same phase as each other and the channel holes are positioned in positions of inflection points of waviness.

* * * * *